US009839156B2

(12) United States Patent
Campbell et al.

(10) Patent No.: US 9,839,156 B2
(45) Date of Patent: Dec. 5, 2017

(54) CIRCUIT BOARD ASSEMBLIES

(71) Applicant: Hamilton Sundstrand Corporation, Charlotte, NC (US)

(72) Inventors: Kris H. Campbell, Poplar Grove, IL (US); Shin Katsumata, Rockford, IL (US); Mark H. Severson, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 15/091,693

(22) Filed: Apr. 6, 2016

(65) Prior Publication Data
US 2017/0295669 A1  Oct. 12, 2017

(51) Int. Cl.
H05K 7/20 (2006.01)
H01L 23/473 (2006.01)

(52) U.S. Cl.
CPC ............... H05K 7/20209 (2013.01)

(58) Field of Classification Search
CPC . G06F 1/181–1/182; H05K 7/20218–7/20381;
H05K 7/20409–7/20418; H05K
7/20009–7/202; H01L 23/367–23/3677;
H01L 23/473; H01L 23/46–23/467
USPC ...... 361/676–678, 679.46–679.54, 688–723;
165/80.1–80.5, 104.33, 185;
174/15.1–15.3, 16.1–16.3, 547, 548;
257/712–722, E23.088; 24/453, 458–459;
454/184; 312/236
See application file for complete search history.

(56) References Cited

U.S. PATENT DOCUMENTS

| 4,750,088 | A | 6/1988 | Friot |
| 5,734,552 | A | 3/1998 | Krein |
| 5,914,857 | A | 6/1999 | Johnson et al. |
| 6,661,666 | B1 | 12/2003 | Dauksher |
| 6,955,215 | B2 | 10/2005 | Al-Garni et al. |
| 7,167,363 | B1* | 1/2007 | Cushman ............ H05K 7/1461 361/690 |
| 7,539,015 | B2 | 5/2009 | Springer et al. |
| 7,760,506 | B1 | 7/2010 | Wang et al. |
| 9,104,388 | B2 | 8/2015 | Yang |
| 9,241,427 | B1 | 1/2016 | Stevens et al. |
| 2002/0024795 | A1* | 2/2002 | Bhatia .................... G06F 1/203 361/679.47 |
| 2002/0081961 | A1* | 6/2002 | Foley ...................... G06F 1/20 454/184 |
| 2004/0165349 | A1* | 8/2004 | Arbogast ................ G06F 1/20 361/695 |
| 2005/0047084 | A1* | 3/2005 | Kabat ............... H05K 7/20563 361/690 |
| 2006/0012957 | A1* | 1/2006 | Arbogast ................ G06F 1/20 361/695 |
| 2006/0067046 | A1* | 3/2006 | Dey ........................ G06F 1/20 361/679.46 |

(Continued)

Primary Examiner — Anthony Haughton
Assistant Examiner — Razmeen Gafur
(74) Attorney, Agent, or Firm — Locke Lord LLP; Joshua L. Jones; Daniel J. Fiorello

(57) ABSTRACT

A circuit board arrangement includes a deflector configured to guide flow over an electronic component on a circuit board disposed in an air flow. A method for thermal management of a circuit board includes modifying an air flow over the circuit board to increase speed or direction the air flow over a component of the circuit board using a deflector.

9 Claims, 4 Drawing Sheets

(56) References Cited

U.S. PATENT DOCUMENTS

| | | | |
|---|---|---|---|
| 2007/0230119 A1* | 10/2007 | Baldwin, Jr. | H05K 7/20563 361/690 |
| 2007/0297144 A1* | 12/2007 | Speciale | H05K 7/1445 361/720 |
| 2008/0062641 A1* | 3/2008 | Lai | H01L 23/467 361/695 |
| 2008/0130225 A1* | 6/2008 | Gilliland | H05K 7/20154 361/695 |
| 2008/0304235 A1* | 12/2008 | Kunkle | H05K 7/209 361/697 |
| 2009/0097204 A1* | 4/2009 | Byers | H05K 7/20572 361/695 |
| 2009/0231813 A1* | 9/2009 | Busch | H01L 23/467 361/702 |
| 2010/0172089 A1* | 7/2010 | Chiu | G06F 1/20 361/679.47 |
| 2010/0226094 A1* | 9/2010 | Attlesey | H05K 7/20772 361/699 |
| 2011/0051358 A1* | 3/2011 | Searby | G06F 1/20 361/679.48 |
| 2011/0080701 A1* | 4/2011 | Bisson | H05K 7/20563 361/679.5 |
| 2011/0110039 A1* | 5/2011 | Feltner | H05K 7/20909 361/695 |
| 2012/0170220 A1* | 7/2012 | Lin | G06F 3/0202 361/695 |
| 2013/0033815 A1* | 2/2013 | Yang | G06F 1/186 361/679.46 |
| 2013/0141867 A1* | 6/2013 | Zhou | H05K 7/20909 361/691 |
| 2013/0342993 A1* | 12/2013 | Singleton | H05K 7/20836 361/690 |
| 2014/0063737 A1* | 3/2014 | Desmarets | H05K 7/20736 361/695 |
| 2014/0218859 A1* | 8/2014 | Shelnutt | G06F 1/206 361/679.46 |
| 2015/0181770 A1 | 6/2015 | Keisling et al. | |
| 2016/0003768 A1 | 1/2016 | Cicero et al. | |

* cited by examiner

CIRCUIT BOARD ASSEMBLIES

BACKGROUND

1. Field

The present disclosure relates to circuit board assemblies, more specifically to circuit board assemblies having flow channels for cooling.

2. Description of Related Art

Electronic assemblies can develop hotspots that preclude air cooling despite the assembly as a whole being applicable for air cooling because these hotspots are too hot to be cooled by air cooling. Traditional systems focus on making airflow turbulent. This is not beneficial in flow stream that is already turbulent.

Such conventional methods and systems have generally been considered satisfactory for their intended purpose. However, there is still a need in the art for improved cooling of circuit board assemblies. The present disclosure provides a solution for this need.

SUMMARY

A circuit thermal management arrangement can include a deflector configured to guide flow over an electronic component on a circuit board disposed in an air flow. The deflector can be configured to increase a speed of air flow over the electronic component or alter the airflow currents. In certain embodiments, the deflector can include an airfoil shape.

In certain embodiments, the deflector can be positioned over a downstream end of the electronic component. The deflector can include a positive angle of incidence relative to the air flow.

In certain embodiments, the deflector can be positioned over an upstream end of the electronic component. The deflector can include a negative angle of incidence relative to the air flow. The arrangement can further include a second deflector positioned over a downstream end of the electronic component. The second deflector can include a positive angle of incidence relative to the air flow.

The first deflector and the second deflector can be connected via a connector member such that the first deflector, the second deflector, and the connector member overlay the electronic component. In certain embodiments, the connector member can be parallel relative to a direction of the flow in the air flow.

A method for thermal management of a circuit board includes modifying an air flow over the circuit board to increase speed or direction the air flow over a component of the circuit board using a deflector.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
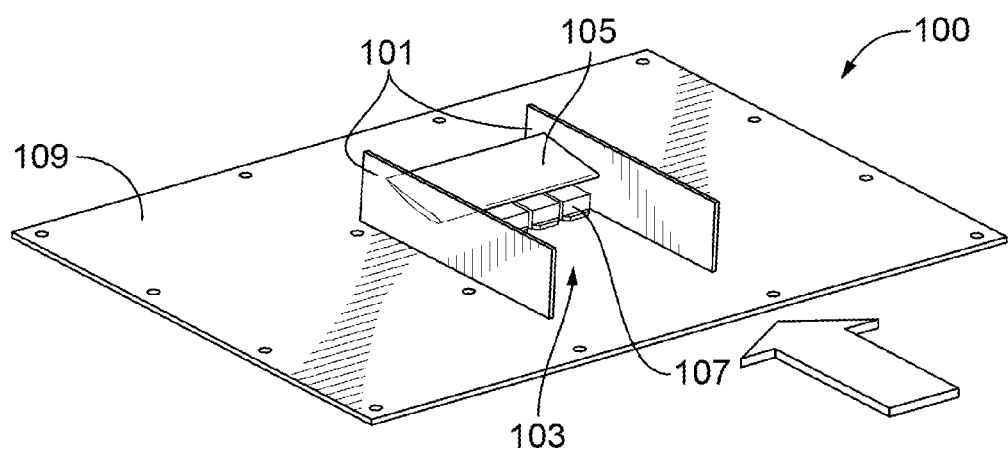
FIG. 1 is a perspective view of an embodiment of an arrangement in accordance with this disclosure, shown having an embodiment of a deflector extending across a flow channel.

Reference will now be made to the drawings wherein like reference numerals identify similar structural features or aspects of the subject disclosure. For purposes of explanation and illustration, and not limitation, an illustrative view of an embodiment of an arrangement in accordance with the disclosure is shown in FIG. 1 and is designated generally by reference character 100. Other embodiments and/or aspects of this disclosure are shown in FIGS. 2-7. The systems and methods described herein can be used to enhance thermal transfer in electronic circuits.

Figure 2:
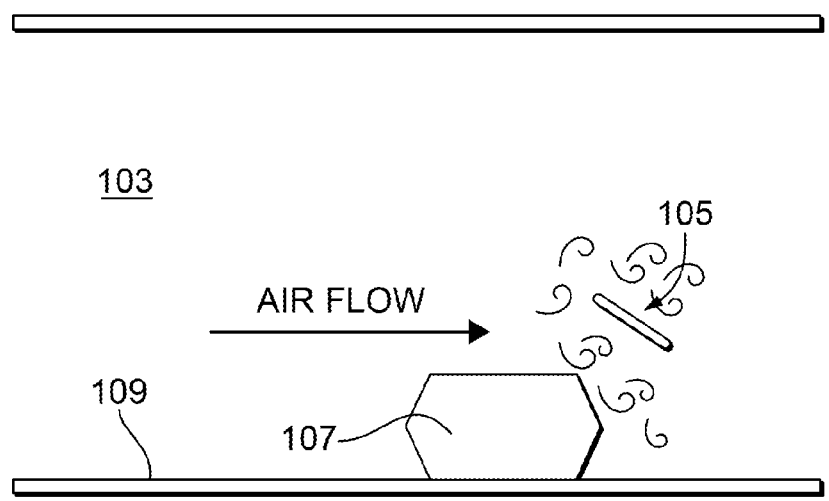
FIG. 2 is a cross-sectional schematic view of an embodiment of an arrangement in accordance with this disclosure, showing air flowing through the flow channel and having a plate deflector.

Referring to FIG. 1, a circuit board arrangement 100 can include one or more electronic components 107 (e.g., that can become hot) on a circuit board 109. A deflector 105 can be disposed over the electronic components 107. The deflector 105 can be configured to guide flow over electronic components 107 on a circuit board 109. In certain embodiments, the deflector 105 can be configured to increase a speed of air flow over the electronic component (e.g., by directing flow down over the electronic component 107 as shown in FIG. 2). Any other suitable function of the deflector 105 for flow modification (e.g., turbulence creation) is contemplated herein (e.g., for cooling or heating).

In certain embodiments, as shown, the deflector 105 can be held over the electronic components 107 via one or more structures (e.g., walls 101). In the embodiment shown, the walls 101 can form at least a portion of a flow channel 103 where the air flow is guided through.

Figure 3:
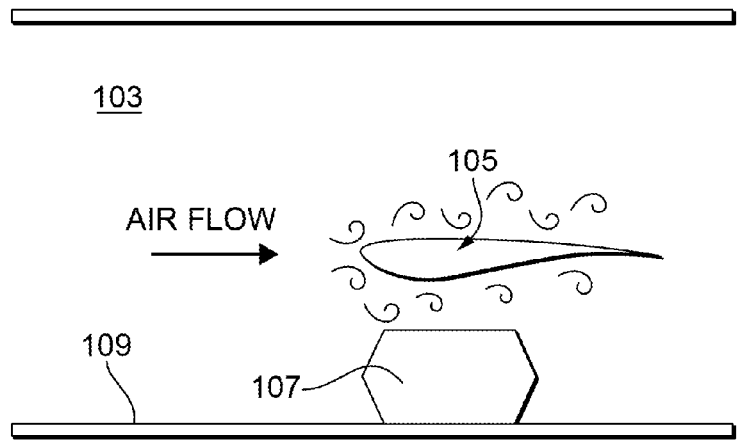
FIG. 3 is a cross-sectional schematic view of an embodiment of an arrangement in accordance with this disclosure, showing air flowing through the flow channel and having an airfoil shaped deflector.

In certain embodiments, the deflector 105 can include an airfoil shape (e.g., as shown in FIG. 3). Any other shape (e.g., a linear cross-sectional shape such as a plate as shown in FIG. 2) is contemplated herein.

Figure 4:
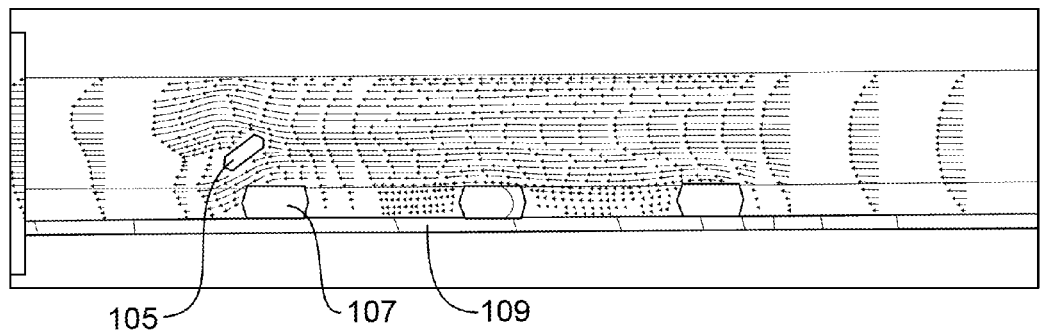
FIG. 4 is a cross-sectional flow diagram of an embodiment of an arrangement in accordance with this disclosure.

Referring to FIG. 4, in certain embodiments, the deflector 105 can be positioned over a downstream end of the electronic component 107. As shown, the deflector 105 can include a positive angle of incidence relative to a flow in the flow channel 103.

Figure 5:
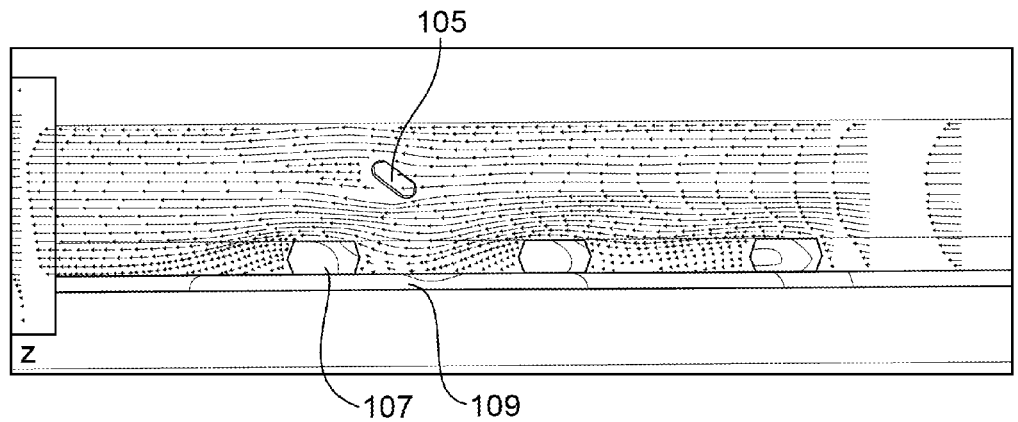
FIG. 5 is a cross-sectional flow diagram of an embodiment of an arrangement in accordance with this disclosure.

Referring to FIG. 5, in certain embodiments, the deflector 105 can be positioned over an upstream end of the electronic component 107. As shown, the deflector 105 can include a negative angle of incidence relative to a flow in the flow channel 103.

Figure 6:
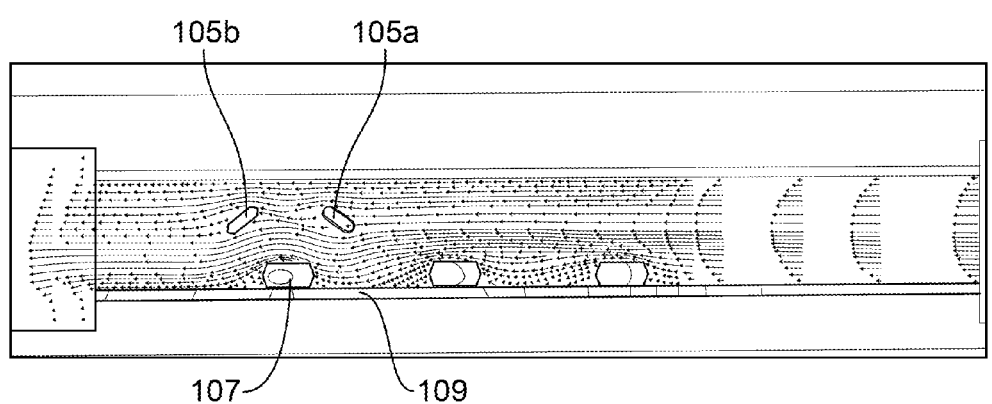
FIG. 6 is a cross-sectional flow diagram of an embodiment of an arrangement in accordance with this disclosure.

Referring to FIG. 6, in certain embodiments, a first deflector 105*a* can be positioned over an upstream end of the electronic component 107 and a second deflector 105*b* can be positioned over a downstream end of the electronic component 107. As shown, the first deflector 105*a* can include a negative angle of incidence relative to a flow in the flow channel 103 and the second deflector 105b can include a positive angle of incidence relative to a flow in the flow channel.

Figure 7:
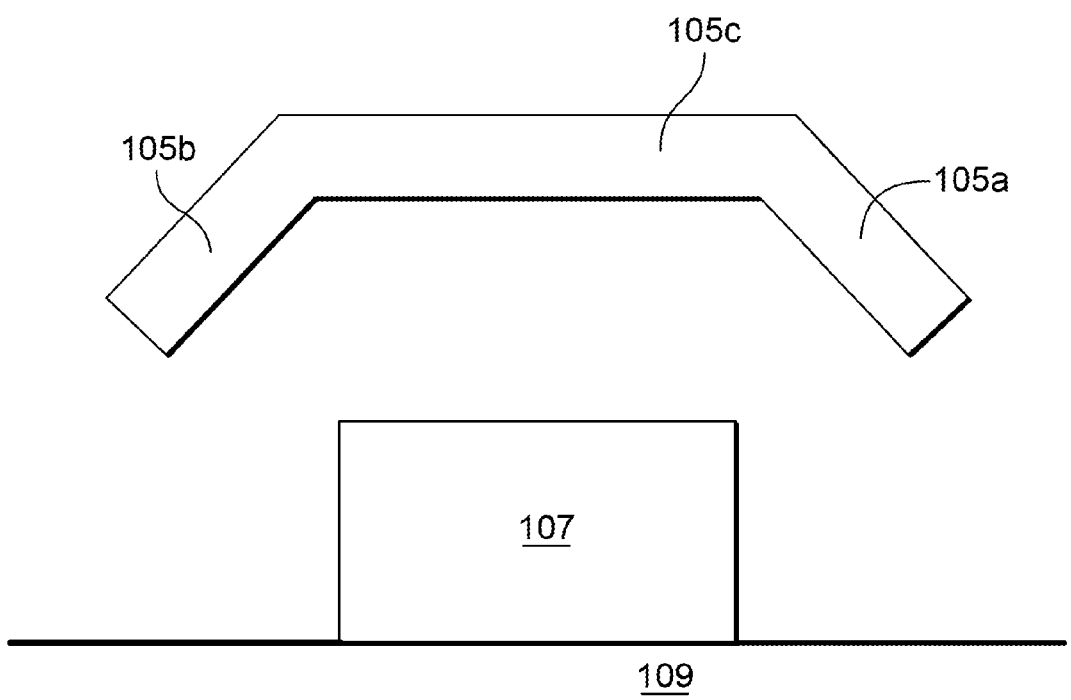
FIG. 7 is a partial cross-sectional view of an embodiment of an arrangement in accordance with this disclosure.

Referring to FIG. 7, in certain embodiments, the first deflector 105a and the second deflector 105b can be connected via a connector member 105c (e.g., and form a single piece as shown) such that the first deflector 105a, the second deflector 105b, and the connector member 105c overlay the electronic component 107. As shown, in certain embodiments, the connector member 105c can be parallel relative to a direction of the flow in the flow channel 103. While the first deflector 105a, the second deflector 105b, and the connector member 105c are shown as a single piece, it is contemplated that these components can be formed of any suitable number of pieces.

Deflectors as described above were analyzed and tested via both computational fluid dynamics and experimental testing to determine the effect of various deflector positions and characteristics. Referring again to FIG. 4, the deflector 105 was placed at middle and downstream of an electronic component 107 (e.g., a third row of electronic components 107 in the direction of flow). The test results showed about 9% to about 22% loss in heat transfer coefficient (HTC) at about 0.35 cubic feet per minute (CFM) (about 0.12 m/s) of airflow and about 4% to about 11% improvement of HTC at about 1.63 CFM (about 0.54 m/s).

Referring again to FIG. 5, the deflector 105 was repositioned to an upstream edge of the electronic component 107, which was shown to increase the velocity of air closer to the electronic component. This configuration provided about 0% to about 7% loss of HTC at 0.35 CFM and about 2% to about 12% improvement of HTC at about 1.63 CFM.

Referring to FIG. 6, a double deflector configuration was tested (having first deflector 105a and second deflector 105b). The electronic components 107 closest to the deflector (e.g., the third row as shown) were shown to have an HTC that was increased by about 12% to about 20% at about 0.35 CFM and about 19% to about 23% at about 1.63 CFM. In the tested embodiment, the first and second deflectors 105a, 105b were plate shaped and were positioned about 2 mm upstream and about 2 mm downstream of the electronic component 107 (in a third row as shown). In this configuration, a second row of electronic components also saw improvement, while a first row of chips were seemingly unaffected.

As described above, one or more deflectors can be added to a printed circuit assembly, for example, to direct the air flow and/or to increase the air velocity near a target component to improve the convective air cooling of the target component and/or adjacent components. Embodiments as described above can have positive cooling effect on the hot spots, for example. Embodiments as disclosed can improve convective cooling on a circuit board. It is contemplated that one having ordinary skill in the art, in view of this disclosure, can modify the deflector shape and/or placement in the flow channel for maximum cooling effectiveness.

A method for thermal management of a circuit board includes modifying an air flow over the circuit board to increase speed or direction the air flow over a component of the circuit board using a deflector.

The methods and systems of the present disclosure, as described above and shown in the drawings, provide for circuit board assemblies with superior properties including improved heat transferred coefficient. While the apparatus and methods of the subject disclosure have been shown and described with reference to embodiments, those skilled in the art will readily appreciate that changes and/or modifications may be made thereto without departing from the spirit and scope of the subject disclosure.

What is claimed is:

1. A circuit thermal management arrangement, comprising:
a deflector configured to guide flow over an electronic component on a circuit board disposed in an air flow, wherein the deflector is positioned over an upstream end of the electronic component.

2. The arrangement of claim 1, wherein the deflector is configured to increase a speed or direction of air flow over the electronic component.

3. The arrangement of claim 1, wherein the deflector includes an asymmetric airfoil shape.

4. The arrangement of claim 1, wherein the deflector includes a negative angle of incidence relative to the air flow.

5. The arrangement of claim 4, wherein the deflector is a first deflector and the arrangement further includes a second deflector positioned over a downstream end of the electronic component.

6. The arrangement of claim 5, wherein the second deflector includes a positive angle of incidence relative to the air flow.

7. The arrangement of claim 6, wherein the first deflector and the second deflector are connected via a connector member such that the first deflector, the second deflector, and the connector member overlay the electronic component.

8. The arrangement of claim 7, wherein the connector member is parallel relative to a direction of the air flow.

9. The arrangement of claim 1, further comprising the circuit board.

* * * * *